United States Patent [19]

Ichikawa

[11] Patent Number: 5,399,514
[45] Date of Patent: Mar. 21, 1995

[54] METHOD FOR MANUFACTURING IMPROVED LIGHTLY DOPED DIFFUSION (LDD) SEMICONDUCTOR DEVICE

[75] Inventor: Matsuo Ichikawa, Suwa, Japan

[73] Assignee: Seiko Epson Corporation, Tokyo, Japan

[21] Appl. No.: 104,274

[22] Filed: Aug. 9, 1993

Related U.S. Application Data

[63] Continuation of Ser. No. 689,223, Apr. 22, 1991, abandoned.

[30] Foreign Application Priority Data

| Apr. 24, 1990 | [JP] | Japan | 2-108028 |
| Apr. 24, 1990 | [JP] | Japan | 2-108029 |
| Jul. 26, 1990 | [JP] | Japan | 2-198820 |

[51] Int. Cl.$^6$ ............................................ H01L 21/336
[52] U.S. Cl. .................................... 437/34; 437/44; 437/57; 437/58
[58] Field of Search .............. 437/34, 41, 44, 56, 437/57, 58

[56] References Cited

U.S. PATENT DOCUMENTS

| 4,562,638 | 1/1986 | Schwabe et al. | 437/44 |
| 4,722,909 | 2/1988 | Parrillo et al. | 437/57 |
| 4,740,484 | 4/1988 | Norstrom et al. | 437/44 |
| 4,745,086 | 5/1988 | Parrillo et al. | 437/57 |
| 4,753,898 | 6/1988 | Parrillo et al. | 437/44 |
| 4,764,477 | 8/1988 | Chang et al. | 437/44 |
| 4,775,642 | 10/1988 | Chang et al. | 437/44 |
| 5,023,190 | 6/1991 | Lee et al. | 437/56 |
| 5,024,960 | 6/1991 | Haken | 437/34 |
| 5,087,582 | 2/1992 | Campbell et al. | 437/41 |
| 5,098,855 | 3/1992 | Komori et al. | 437/44 |
| 5,122,474 | 6/1992 | Harrington, III | 437/57 |
| 5,153,144 | 10/1992 | Komori et al. | 437/44 |
| 5,170,232 | 12/1992 | Narita | 437/44 |
| 5,246,872 | 9/1993 | Mortensen | 437/44 |
| 5,262,344 | 11/1993 | Mistry | 437/57 |

OTHER PUBLICATIONS

Wolf et al. *Silicon Processing for the VLSI Era*, vol. 1, Lattice Press, 1986, pp. 209–210.

*Primary Examiner*—Mary Wilczewski
*Attorney, Agent, or Firm*—Harold T. Tsiang

[57] ABSTRACT

A semiconductor device comprises at least one p-type and n-type LDD transistors in a pair and a standard (non-LDD) transistor in the same substrate. Appropriate p-wells and n-wells are formed in the substrate, gate electrodes deposited, p-type and n-type first diffusions made, a silicon nitride layer is deposited and removed to leave behind sidewalls on the gates, p-type and n-type second diffusions are made in the LDD transistors, the silicon nitride sidewalls are washed away with a solvent that attacks only the silicon nitride, a third diffusion is made in the standard (non-LDD) transistor(s), a phosphosilicate glass (PSG) layer is applied, contact holes are etched, and an aluminum metalization layer is applied and etched for the interconnect.

14 Claims, 4 Drawing Sheets

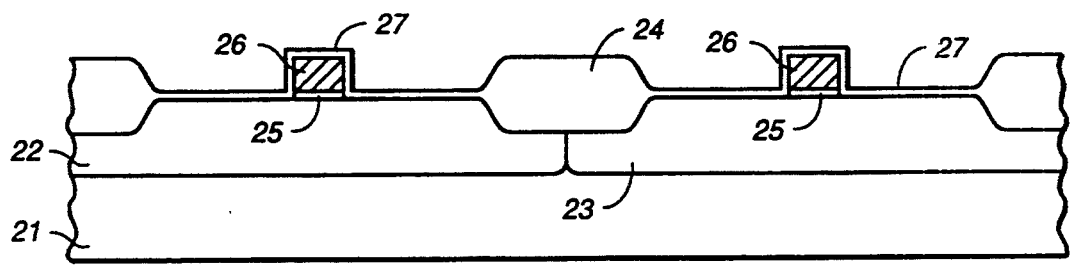
FIG._1A (PRIOR ART)
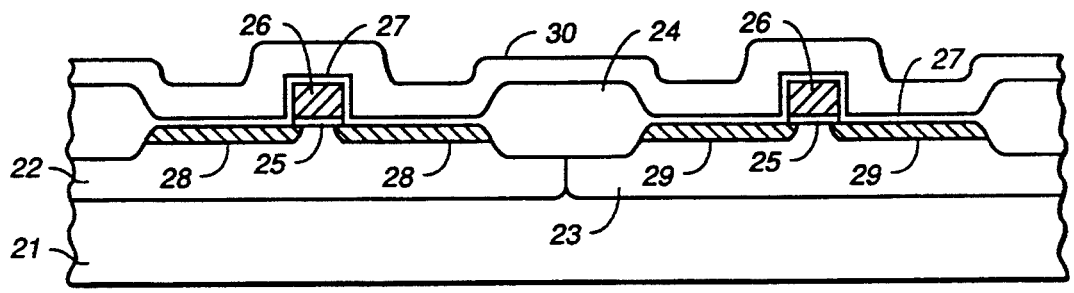
FIG._1B (PRIOR ART)
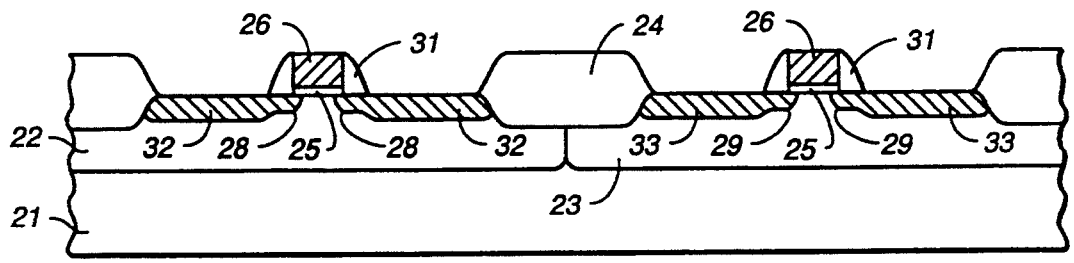
FIG._1C (PRIOR ART)
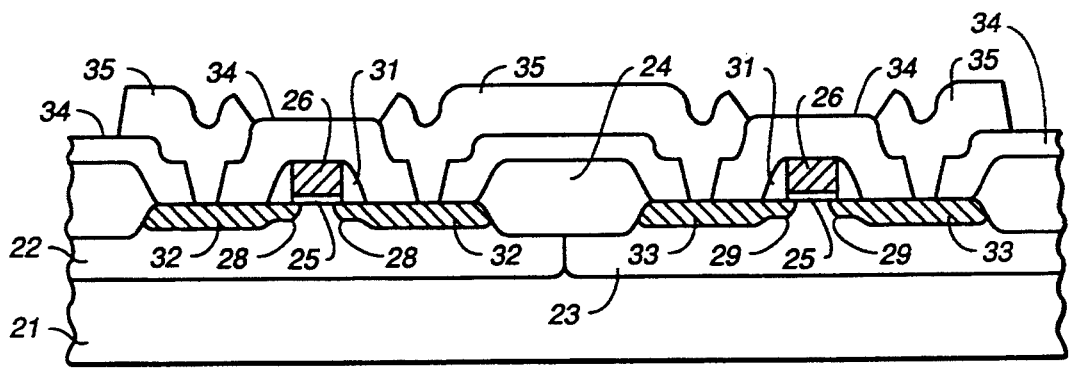
FIG._1D (PRIOR ART)

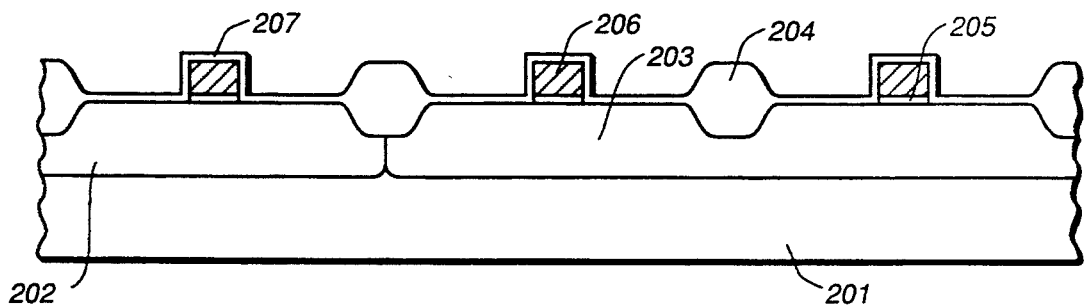
FIG._2A
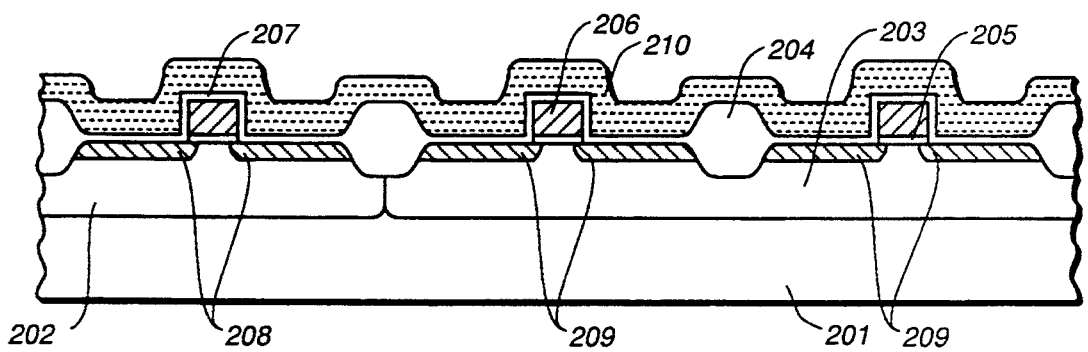
FIG._2B
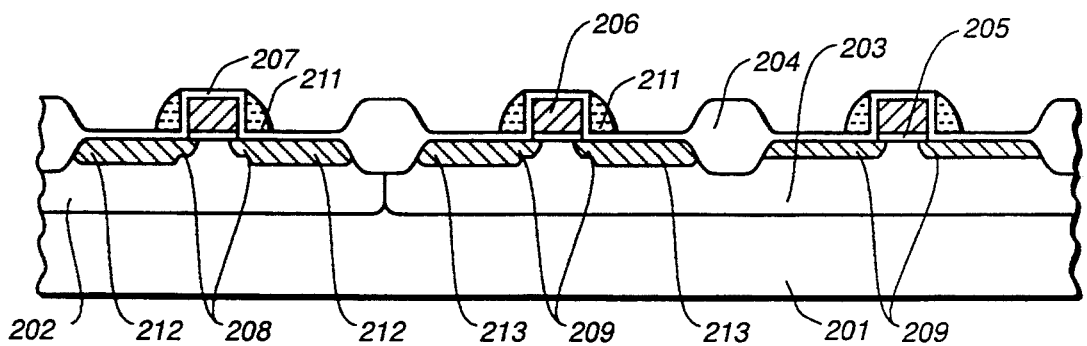
FIG._2C

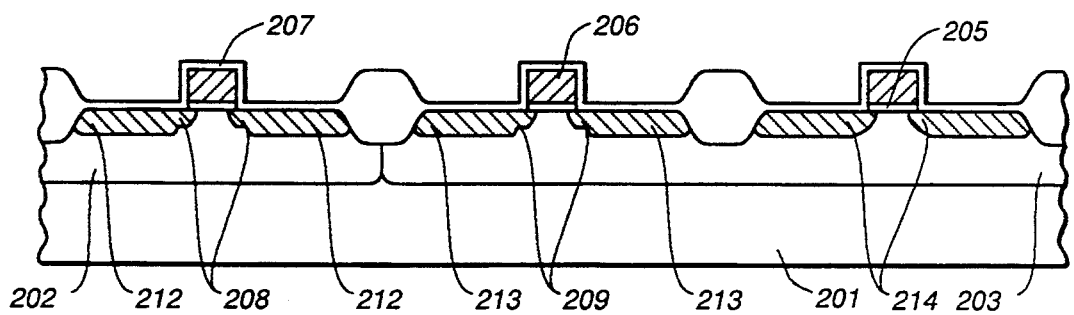
FIG._2D
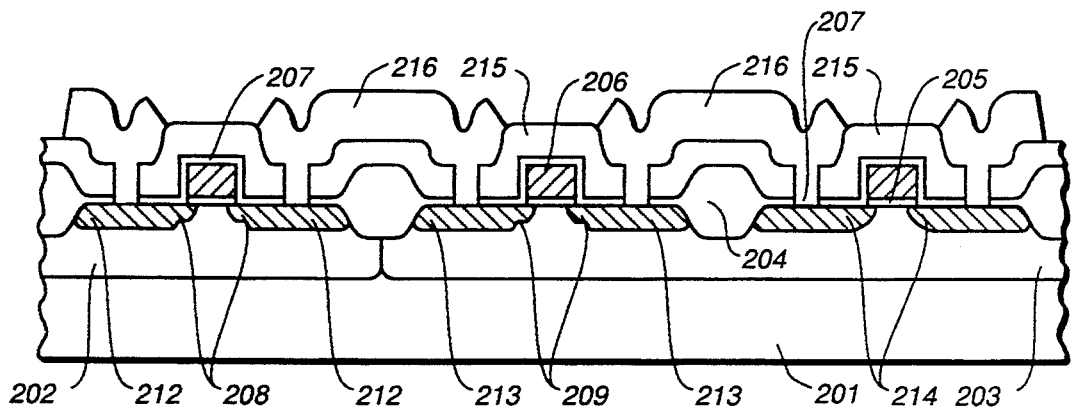
FIG._2E

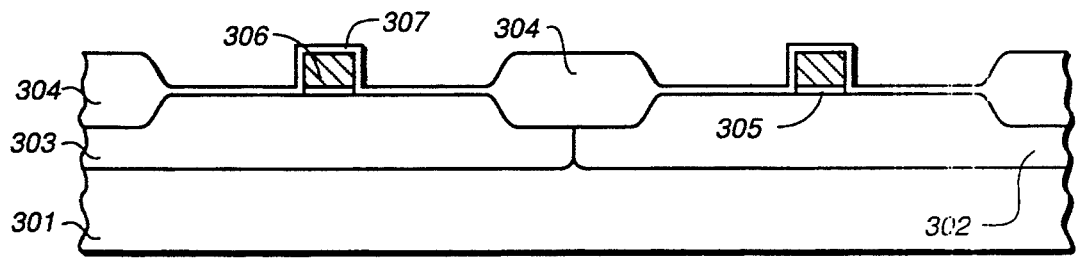
FIG._3A
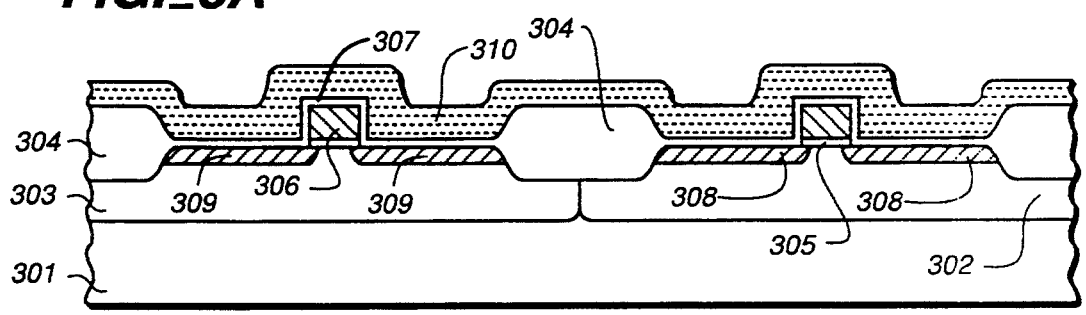
FIG._3B
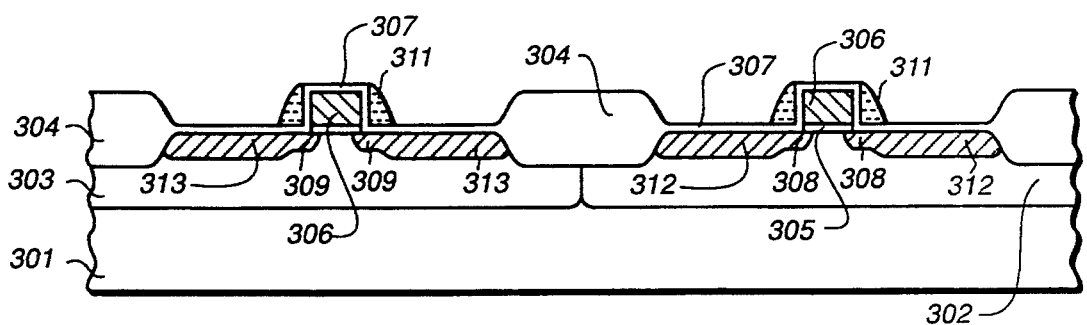
FIG._3C
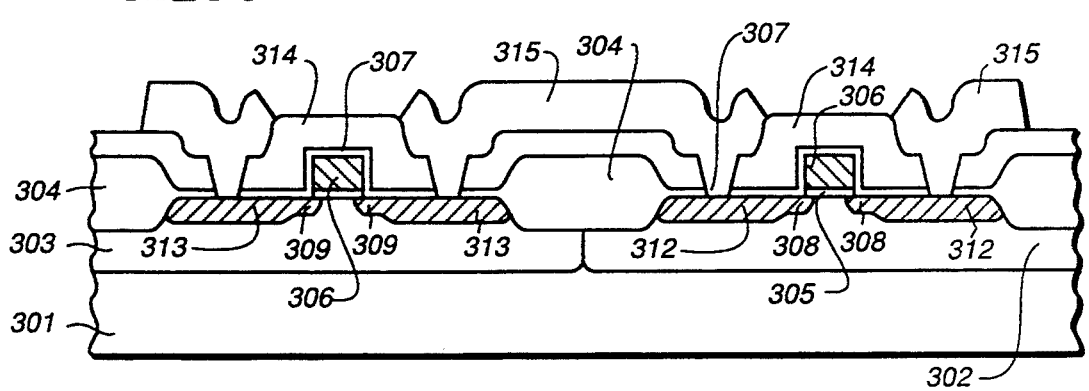
FIG._3D

METHOD FOR MANUFACTURING IMPROVED LIGHTLY DOPED DIFFUSION (LDD) SEMICONDUCTOR DEVICE

This is a Continuation of the following U.S. application under Rule 1.60: Ser. No. 07/689,223 filed Apr. 22, 1991, abandoned.

BACKGROUND OF THE INVENTION

This invention relates generally to metal-insulator-semiconductor (MIS) devices and production methods and more particularly to improving the ability 16 scale-down and manufacturing consistency in the performance characteristics of MIS semiconductor devices having lightly-doped diffusion (LDD) structures.

As microminiaturization of metal-oxide-semiconductor (MOS) transistors progresses to ever smaller geometries, two different effects are becoming larger and larger problems due to short-channel limitations. These are the "punch-through" and "hot-carrier injection" effects. For a bipolar transistor with a very narrow base width, or a base with relatively low doping, breakdown can be caused by the punch-through effect, in which the neutral base width is reduced to zero at a sufficient Vcb and the collector depletion region is in direct contact with the emitter depletion region. In a MOS transistor, a concentration of the electric field at the end of the drain causes hot carriers to be captured mainly at the interface between the substrate and the insulator film or in the insulator film. The operating characteristics of such MOS transistors can drift, due to an accumulation of the electric charge. As the size of MOSFET gates decreases with advancing technology, MOS transistors used in very-large-scale integration (VLSI) circuits have been constrained by the voltage on the drain concentrating in the vicinity of the gate. This intensification causes a deterioration in the performance of the semiconductor device due a naturally occurring infusion of hot-carriers.

The state of the art has advanced beyond using 1.2 micron to 1.3 micron processes. As a result, transistors with lightly doped drain (LDD) structures have become one of the most popular types used, because the hot-carrier problem is alleviated in such structures. FIGS. 1A–1D show cross sections of a typical prior art LDD transistor after each of the principal manufacturing steps in a prior art process. In FIG. 1A, an n-well 22 and p-well 23 have been diffused in n-type silicon substrate 21. A LOCOS oxide layer 24 is then formed with a selective oxide method. Around LOCOS oxide layer 24 an oxide film 25 is formed. A polycrystalline silicon film is deposited, followed by an n+ diffusion that produces an n+ polycrystalline silicon layer which is highly conductive. Selective etching of the n+ polycrystalline silicon layer results in gate electrode 26. A light oxidation step, using an oxygen atmosphere, forms oxide film 27. In FIG. 1B, p-type diffusions 28 are selectively implanted using boron ions. One diffusion 28 forms the source and the other diffusion 28 forms the drain of a p-channel transistor thus created. (The drain and source are practically interchangeable.) The implantation energy used runs from a low of 20 Kev to a high of 40 Kev. The p-type first implantation concentration is preferably within the range of $5 \times 10^{12}/cm^2$ to $5 \times 10^{13}/cm^2$. Another implantation step, this time n-type using phosphorous ions, produces diffusions 29 in p-well 23. These diffusions result in source and drain areas of an n-channel transistor. The implantation energy used typically ranges from 30 Key to 60 Kev, to produce the most desirable n-type first implantation concentration of impurity atoms between $5 \times 10^{12}/cm^2$ and $5 \times 10^{13}/cm^2$. An oxygen atmosphere and a CVD deposition method then are combined to deposit a silicon dioxide layer 30 that has a film thickness of between 2000 and 4000 angstroms (Å). FIG. 1C shows that on each side of gate electrode 26, a sidewall 31 remains after anisotropic etching away of the other areas of layers 27 and 30. The gate 26 and sidewall 31 are then used to shadow (mask) the substrate under the two of them from receiving a heavy impurity concentration in the next few steps. A p-type second diffusion layer 32 drives into most of layer 28 deeper and with a heavier concentration of boron ions. The implantation energy in this p-type second diffusion preferably is set between 20 Key and 60 Kev. The most desirable implantation concentration at this point is a low of $1 \times 10^{15}/cm^2$ to a high of $1 \times 10^{16}/cm^2$. A n-type second diffusion layer 33 is driven in to replace most of layer 29 by implanting arsenic ions. The implantation energy is preferably set between 40 Key and 80 Key. The implantation concentration should best be targeted to be between $1 \times 10^{15}/cm^2$ and $1 \times 10^{16}/cm^2$. FIG. 1D shows a CVD deposited silicon dioxide layer 34 covering gate electrodes 26. Then contact holes are etched to give access to diffusions 32 and 33. An aluminum interconnect layer 35 is then deposited which connects to the diffusions 32 and 33 through the accesses in layer 34.

It is difficult, however, to control the width of sidewalls 31 to have a uniform film thickness, or a target film thickness, over the entire surface of a 5-inch or 6-inch semiconductor wafer. A variety of processing methods are used in the prior art to form sidewalls 31, including low-pressure, plasma formation, and atmospheric pressure methods. Any of these methods typically has a ±20% variation in target film thickness and a ±15% variation in coverage across the wafer. Within a single wafer, the variation can commonly run as high as 900 Å, for a 3000 Å thick film. Between wafers in a lot, there can be as much as a 1200 Å variation.

A sidewall 31 made with film thicknesses subject to large variations will also show large variations in width. And if the width varies, then the lengths of the p-type first and n-type diffusion layers will likewise vary. This variation will appear as an uncontrolled variation in channel resistance for the affected transistors. The obvious result consequence is variations will be produced in transistor performance. As circuit geometries continue to get even finer with the advancing state-of-the-art, the channel length under the gates gets shorter, and the variations in series resistance gets more pronounced. As such, the above problem can limit using smaller device geometries, because device yields fall to unacceptable levels.

The present invention eliminates variations in the thickness of the sidewall, and therefore eliminates any variations in the lengths of the p-type and n-type diffusion layers. It also eliminates a source of impurities that can eventually poison a gate electrode and inject in the gate an artificial charge that affects the transistor's threshold voltage.

SUMMARY OF THE INVENTION

According to one embodiment of the present invention, a semiconductor device comprises at least one p-type and n-type LDD transistors in a pair and a standard (non-LDD) transistor in the same substrate. Appropriate p-wells and n-wells are formed in the substrate, gate electrodes deposited, p-type and n-type first diffusions, a silicon nitride layer is deposited and etched away to leave behind sidewalls on the gates, p-type and n-type second diffusions are made in the LDD transistors, the silicon nitride sidewalls are washed away in a solvent that attacks only the silicon nitride, a third diffusion is made in the standard (non-LDD) transistors, a phosphosilicate glass layer is applied, contact holes are etched, and an aluminum metalization layer is applied and etched for the interconnect.

An advantage of the present invention is that variations in film thickness are reduced between wafers, within a single wafer, and between wafer batches.

A further advantage of the present invention is that the length of the p-type first and n-type diffusion layers can be controlled by using a silicon nitride film that has excellent uniformity in production. This contributes to consistently uniform transistor performance, even within a single wafer, between wafers and between batches of wafers.

A further advantage of the present invention is that finer circuit geometries can be realized.

A further advantage of the present invention is that the variation in the film thickness of the silicon nitride layer between wafers will not exceed $\pm 5\%$. Within a single wafer, it is no more than $\pm 3\%$, and between lots $\pm 7\%$ is the limit.

A further advantage of the present invention is that there exists substantially no variation between the thickness on the flat areas and on both sides of the gate electrode. In contrast, the width of the sides of the phosphosilicate glass (PSG) layer tends to be thin and the shape will vary (because of the differences in how the film attaches to tops and bottoms of the sides).

A further advantage of the present invention is that the sidewalls on the gates also are uniform. As a result, the lengths of the p-type first and n-type first diffusion layers is uniform, making the performance of the transistors also uniform. Finer geometries can therefore be tolerated.

A further advantage of the present invention is that a silicon nitride layer is ideally suited to dry etching compared to that of a phosphosilicate glass (PSG) layer used in the prior art. More production device uniformity can be realized, because with a thin oxide base, the end point can be detected.

A further advantage of the present invention is that, in the prior art, a thick film remains as the sidewall on a thin diffusion layer. The sidewall contains contaminants and can be charged (e.g., impurity ions). This will negatively impact transistor performance, by causing uncontrolled variations in the performance of individual transistors. However, using the methodology of this invention, the silicon nitride sidewall film is removed, thus eliminating the possibility of such defects.

A further advantage of the present invention is that, for probably the first time, transistors with an LDD structure and transistors with a standard structure can be fabricated on the same substrate. As a result, the LDD structure can be used for higher voltage transistors that need immunity against the hot-electron effect, while the standard structure can be used for transistors where high speed and output current with lower voltages is needed.

A further advantage of the present invention is that LDD structures can be freely placed in required locations in the peripheral circuitry of a memory device, while transistors with conventional (non-LDD) structures can be placed in other areas and in the memory cells, where the voltage is lower and cell sizes must be kept to an absolute minimum.

A further advantage of the present invention is that the variation in the film thickness of the polycrystalline silicon layer between wafers is within $\pm 5\%$. Within a single wafer, it is $\pm 3\%$, and between lots is $\pm 7\%$.

These and other objects and advantages of the present invention will no doubt become obvious to those of ordinary skill in the art after having read the following detailed description of the preferred embodiments which are illustrated in the various drawing figures.

BRIEF DESCRIPTION OF DRAWINGS

FIGS. 1A–1D are cross sections of a prior art MOSFET device with an LDD structure shown at various stages of its manufacture;

FIGS. 2A–2E are cross sections of a semiconductor device with an LDD structure shown at various stages of its manufacture, according to a first embodiment of the present invention; and FIGS. 3A–3D are cross sections of a semiconductor device with an LDD structure shown at various stages of its manufacture, according to second and third embodiments of the present invention.

DESCRIPTION OF PREFERRED EMBODIMENTS

First Embodiment—FIGS. 2A–2E illustrate cross-sections of an LDD MOSFET after each of the principal manufacturing steps. Three transistors are shown, because two is fabricated in the steps following here as an p-channel/n-channel LDD pair, and the third is an ordinary (non-LDD) n-channel transistor. The process described makes this unique structure both practical and useful in memory device applications having mixed low voltage (3 V) memory cells and higher voltage (5 V) interfaces to the outside (TTL) world.

In FIG. 2A, an n-well 202 and a p-well 203 are diffused in an n-type single crystal silicon substrate 201. A "LOCOS" oxide layer 204 is formed using a selective oxide method. LOCOS isolation is used to produce self-aligned implants to a field oxide. (See, Rabbat, G., *Handbook of Advanced Semiconductor Technology and Computer Systems*, (Van Nostrand Reinhold Co.: New York) 1988, pp. 233–235 [LOCOS isolation process steps].) In a region other than one where LOCOS oxide layer 204 has been formed, a gate oxide layer 205 is laid down. Then an n+ polycrystalline silicon layer is deposited with conventional techniques. The n+ polycrystalline silicon layer is later selectively etched to give shape to gate electrode 206. A thin oxide layer 207 made next. In FIG. 2B, a p-type first diffusion layer 208 results by selectively implanting boron ions at an implantation energy from 20 Key to 40 Key. The implantation concentration that results is preferably within $5 \times 10^{12}/cm^2$ to $5 \times 10^{13}/cm^2$. An n-type first diffusion layer 209 is similarly formed by implanting phosphorous ions. The implantation energy should be 30 Kev to 60 Key, and the implantation concentration is best if it is between $5 \times 10^{12}/cm^2$ to $5 \times 10^{13}/cm^2$. After a light oxidation, a silicon nitride layer 210 between 1000 and 4000 Å thick is deposited. (Polycrystalline silicon can also be used instead of the silicon nitride, and would constitute an alternative embodiment of the present invention that would still be fairly represented by FIGS. 2A–2E.) FIG. 2C shows silicon nitride layer 210 after most parts of it have been subsequently removed by anisotropic etching; What remains are silicon nitride sidewalls 211 (on the sides of gate electrodes 206). A p-type second diffusion layer 212 is driven in by selectively implanting boron ions. The implantation energy should be between 20 Key and 60 Key. The implantation concentration is preferably somewhere between $1 \times 10^{15}/cm^2$ and $1 \times 10^{16}/cm^2$. An n-type second diffusion layer 213 is similarly constructed by selectively implanting arsenic ions at an implantation energy between 40 Kev and 80 Key. The implantation concentration is best targeted to be more than $1 \times 10^{15}/cm^2$ but less than $1 \times 10^{16}/cm^2$. Silicon nitride in sidewalls 211 can be removed either by isotropic dry etching or by using hot phosphoric acid. An n-type third diffusion layer 214 in the n-channel transistor (far right in FIGS. 2A–2E) is made by selectively implanting arsenic ions. The implantation energy at the time is from 40 Key to 80 Key. The implantation concentration is best from $1 \times 10^{15}/cm^2$ to $1 \times 10^{16}/cm^2$. The net effect of this third diffusion 214 is to convert the affected transistor from an LDD type to a non-LDD type. (Note the diffusion shapes in FIGS. 2A–2E under the respective gates 206.) In FIG. 2E, a phosphosilicate glass (PSG) layer 215 is deposited following a light oxidation of the device surface in an oxygen atmosphere. After PSG annealing, contact holes are etched through PSG layer 215 and thin oxide layer 207 to access the diffusions. Then an aluminum interconnect layer 216 is deposited that connects to the diffusions through the contact holes.

The above method can be used to produce a semiconductor memory device having the structure shown in FIG. 2E. The respective transistors would be organized into a matrix, taking advantage of the fact that the LDD and non-LDD transistors can have different device geometries and operated at substantially different voltages to make an extremely dense, low-voltage memory array with regular five volt external interfaces.

Second Embodiment—FIGS. 3A–3D show cross sections of a MOS semiconductor device after each of the significant manufacturing steps used to fabricate the device. As indicated in FIG. 3A, an n-well 302 and a p-well 303 are formed in an n-type single crystal silicon substrate 301. A LOCOS oxide layer 304 is formed using a selective oxide method. Outside the area of LOCOS oxide layer 304, a gate oxide layer 305 is formed. A polycrystalline silicon layer is deposited on top of layer 305, followed by an n+ diffusion to form an n+ polycrystalline silicon layer. The n+ polycrystalline silicon layer is selectively etched to form gate electrode 306. A light oxidation in an oxygen atmosphere forms thin oxide layer 307. In FIG. 3B, the p-type first diffusion layer 308 is injected into the p-channel transistor source and drain areas by selectively implanting boron ions. The implantation energy is about 20 Key to 40 Kev. The implantation concentration is best from $5 \times 10^{12}/cm^2$ to $5 \times 10^{13}/cm^2$. An n-type first diffusion layer 309 is injected in the n-channel transistor source and drain areas by selectively implanting phosphorous ions. The implantation energy for this step is about 30 Kev to 60 Kev. The implantation concentration is preferably between $5 \times 10^{12}/cm^2$ and $5 \times 10^{13}/cm^2$. Another light oxidation in an oxygen atmosphere is followed by depositing silicon nitride layer 310 with a film thickness between 1000 Å and 4000 Å. Referring to FIG. 3C, parts of silicon nitride layer 310 are removed from by anisotropic etching. Silicon nitride sidewalls 311 remain on each side of the gate electrodes. A p-type second diffusion layer 312 is injected into the p-channel transistor source and drain areas by selectively implanting boron ions. The implantation energy is now preferably somewhere between 20 Kev and 60 Kev. The implantation concentration is best from a low of $1 \times 10^{15}/cm^2$ to a high of $1 \times 10^{16}/cm^2$. An n-type second diffusion layer 313 is injected into the n-channel transistor source and drain areas by selectively implanting arsenic ions. The implantation energy should be about 40 Kev to 80 Kev. The implantation concentration is best from $1 \times 10^{15}/cm^2$ to $1 \times 10^{15}/cm^2$. In FIG. 3D, the sidewalls 311 are removed (as well as any other residual silicon nitride) by isotropic dry etching or by hot phosphoric acid. After a light oxidation in an oxygen atmosphere, a phosphosilicate glass (PSG) layer 314 is deposited. After PSG annealing, contact holes are etched through PSG layer 314 and thin oxide layer 307 to access the diffusions. Then an aluminum interconnect layer 315 is deposited that connects to the diffusions through the contact holes.

Third Embodiment—A third embodiment of the present invention is the same as the second embodiment, except that polycrystalline silicon is used instead of silicon nitride for layer 310. Resulting sidewalls 311 will, of course, also comprise polycrystalline silicon, instead of silicon nitride. The polycrystalline silicon is removed by isotropic dry etching or by a solution of nitric acid and hydrofluoric acid.

The above described methods can be used to produce semiconductor devices having the structures shown in FIGS. 2E and 3D and will have some or all of the advantages also described above. While invention has been described in conjunction with several specific embodiments, it is evident to those skilled in art that many further alternatives, modifications and variations are possible, in light of the foregoing description. Thus, the invention described herein is intended to embrace all such alternatives, modifications, applications and variations as may fall within the spirit and scope of appended claims.

What is claimed is:

1. A method for manufacturing complementary metal-oxide-semiconductor transistors in a semiconductor substrate, the transistors including a first transistor having a channel of a first conductivity type and a second transistor having a channel of a second conductivity type, the method comprising:
    forming first and second gates on the substrate for the first and second transistors, respectively;
    forming a thin insulating layer over the gates and the substrate;
    forming a lightly doped region of the first conductivity type that partially extends underneath each side of the first gate in the substrate;
    forming a lightly doped region of the second conductivity type that partially extends underneath each side of the second gate in the substrate;
    concurrently forming sidewalls on the two sides of the first and second gates;
    forming a heavily doped region of the first conductivity type on each side of the first gate in the substrate using the first gate and the sidewalls on the first gate as a mask;
    forming a heavily doped region of the second conductivity type on each side of the second gate in the substrate using the second gate and the sidewalls on the second gate as a mask; and concurrently removing the sidewalls on the two sides of the first and second gates so that the first and second transistors are formed as LDD type transistors.

2. The method of claim 1, wherein:
the step of forming a lightly doped region of the first conductivity type includes implanting low concentration impurity ions of the first conductivity type into the substrate on each side of the first gate;
the step of forming a lightly doped region of the second conductivity type includes implanting low concentration impurity ions of the second conductivity type into the substrate on each side of the second gate;
the step of forming a heavily doped region of the first conductivity type includes implanting high concentration impurity ions of the first conductivity type into the substrate on each side of the first gate; and
the step of forming a heavily doped region of the second conductivity type includes implanting high concentration impurity ions of the second conductivity type into the substrate on each side of the second gate.

3. The method of claim 2, wherein:
forming sidewalls comprises forming silicon nitride sidewalls;
implanting low concentration impurity ions of the first conductivity type includes implanting low concentration impurity ions of p-type conductivity;
implanting low concentration impurity ions of the second conductivity type includes implanting low concentration impurity ions of n-type conductivity;
implanting high concentration impurity ions of the first conductivity type includes implanting high concentration impurity ions of p-type conductivity;
implanting high concentration impurity ions of the second conductivity type includes implanting high concentration impurity ions of n-type conductivity;
the first transistor is formed as a p-channel MOS transistor; and
the second transistor is formed as an n-channel MOS transistor.

4. The method of claim 2 wherein the step of forming sidewalls comprises forming a silicon nitride layer on the thin insulating layer and etching the silicon nitride layer to form the sidewalls.

5. The method of claim 2 wherein the step of forming sidewalls comprises forming a polycrystalline silicon layer on the thin insulating layer and etching the silicon layer to form the sidewalls.

6. The method of claim 2 wherein
forming sidewalls comprises forming polycrystalline silicon sidewalls;
implanting low concentration impurity ions of the first conductivity type includes implanting low concentration impurity ions of p-type conductivity;
implanting low concentration impurity ions of the second conductivity type includes implanting low concentration impurity ions of n-type conductivity;
implanting high concentration impurity ions of the first conductivity type includes implanting high concentration impurity ions of p-type conductivity;
implanting high concentration impurity ions of the second conductivity type includes implanting high concentration impurity ions of n-type conductivity;
the first transistor is formed as a p-channel MOS transistor; and
the second transistor is formed as an n-channel MOS transistor.

7. The method of claim 6 further comprising:
forming a phosphosilicate glass layer on the thin insulating layer; and
creating contact holes in the glass layer and the thin insulating layer to expose the substrate at the sources and drains of the transistors.

8. A method for manufacturing complementary metal-oxide-semiconductor transistors in a semiconductor substrate, the transistors including a first transistor having a channel of a first conductivity type, and second and third transistors each having a channel of a second conductivity type, the method comprising:
forming first, second and third gates on the substrate for the first, second and third transistors, respectively;
forming a thin insulating layer over the gates and the substrate;
forming a lightly doped region of the first conductivity type that partially extends underneath each side of the first gate in the substrate;
forming a lightly doped region of the second conductivity type that partially extends underneath each side of the second and third gates in the substrate;
concurrently forming sidewalls on the two sides of the first, second and third gates;
forming a heavily doped region of the first conductivity type on each side of the first gate in the substrate using the first gate and the sidewalls on the first gate as a mask;
forming a heavily doped region of the second conductivity type on each side of the second gate in the substrate using the second gate and the sidewalls on the second gate as a mask;
concurrently removing the sidewalls on the two sides of the first, second and third gates so that the first and second transistors are formed as LDD type transistors; and
forming a heavily doped region of the second conductivity type on each side of the third gate in the substrate so that the third transistor is formed as a non-LDD type transistor.

9. The method of claim 8, wherein:
the step of forming a lightly doped region of the first conductivity type includes implanting low concentration impurity ions of the first conductivity type into the substrate on each side of the first gate;
the step of forming a lightly doped region of the second conductivity type includes implanting low concentration impurity ions of the second conductivity type into the substrate on each side of the second and third gates;
the step of forming a heavily doped region of the first conductivity type includes implanting high concentration impurity ions of the first conductivity type into the substrate on each side of the first gate;
the step of forming a heavily doped region of the second conductivity type underneath each side of the second gate includes implanting high concentration impurity ions of the second conductivity type into the substrate on each side of the second gate; and
the step of forming a heavily doped region of the second conductivity type underneath each side of the third gate includes implanting high concentration impurity ions of the second conductivity type into the substrate on each side of the third gate.

10. The method of claim 9, wherein:
    forming sidewalls comprises forming silicon nitride sidewalls;
    implanting low concentration impurity ions of the first conductivity type includes implanting low concentration impurity ions of p-type conductivity;
    implanting low concentration impurity ions of the second conductivity type includes implanting low concentration impurity ions of n-type conductivity;
    implanting high concentration impurity ions of the first conductivity type includes implanting high concentration impurity ions of p-type conductivity;
    implanting high concentration impurity ions of the second conductivity type includes implanting high concentration impurity ions of n-type conductivity;
    the first transistor is formed as a p-channel MOS transistor; and
    the second transistor is formed as an n-channel MOS transistor.

11. The method of claim 9 wherein
    forming sidewalls comprises forming polycrystalline silicon sidewalls;
    implanting low concentration impurity ions of the first conductivity type includes implanting low concentration impurity ions of p-type conductivity;
    implanting low concentration impurity ions of the second conductivity type includes implanting low concentration impurity ions of n-type conductivity;
    implanting high concentration impurity ions of the first conductivity type includes implanting high concentration impurity ions of p-type conductivity;
    implanting high concentration impurity ions of the second conductivity type includes implanting high concentration impurity ions of n-type conductivity;
    the first transistor is formed as a p-channel MOS transistor; and
    the second transistor is formed as an n-channel MOS transistor.

12. The method of claim 11 further comprising:
    forming a phosphosilicate glass layer over the thin insulating layer; and
    creating contact holes in the glass layer and the thin insulating layer to expose the substrate at the sources and drains of the transistors.

13. The method of claim 9 wherein the step of forming sidewalls comprises forming a silicon nitride layer on the thin insulating layer and etching the silicon nitride layer to form the sidewalls.

14. The method of claim 9 wherein the step of forming sidewalls comprises forming a polycrystalline silicon layer on the thin insulating layer and etching the silicon layer to form the sidewalls.

* * * * *

UNITED STATES PATENT AND TRADEMARK OFFICE
CERTIFICATE OF CORRECTION

PATENT NO. : 5,399,514

DATED : March 21, 1995

INVENTOR(S) : MATSUO Ichikawa

It is certified that error appears in the above-indentified patent and that said Letters Patent is hereby corrected as shown below:

On the cover page, Item [56] Reference Cited, U. S. Patent Documents, add --5,183,773   2/1993   Miyata............437/44--.

Signed and Sealed this

Sixteenth Day of April, 1996

Attest:

BRUCE LEHMAN

Attesting Officer

Commissioner of Patents and Trademarks